United States Patent [19]
Pan

[11] Patent Number: 5,667,424
[45] Date of Patent: Sep. 16, 1997

[54] NEW CHEMICAL MECHANICAL PLANARIZATION (CMP) END POINT DETECTION APPARATUS

[75] Inventor: Yang Pan, Singaporee, Singapore

[73] Assignee: Chartered Semiconductor Manufacturing Pte Ltd., Singapore, Singapore

[21] Appl. No.: 719,346

[22] Filed: Sep. 25, 1996

[51] Int. Cl.$^6$ .................................................. B24B 49/00
[52] U.S. Cl. .................... 451/6; 451/5; 451/9; 451/41; 451/285; 451/286; 451/287; 451/288; 451/289; 451/290
[58] Field of Search ................ 451/5, 6, 9, 285–290, 451/41

[56] References Cited

U.S. PATENT DOCUMENTS

| | | | |
|---|---|---|---|
| 5,196,353 | 3/1993 | Sandhu et al. | 437/8 |
| 5,240,552 | 8/1993 | Yu et al. | 156/636 |
| 5,308,438 | 5/1994 | Cote et al. | 156/636 |
| 5,337,015 | 8/1994 | Lustig et al. | 324/671 |
| 5,483,568 | 1/1996 | Yano et al. | 451/6 |

*Primary Examiner*—Robert A. Rose
*Assistant Examiner*—George Nguye
*Attorney, Agent, or Firm*—George O. Saile

[57] ABSTRACT

A chemical mechanical planarization polishing machine that includes a means for the detection of planarization end point is described. The chemical mechanical planarization polishing machine includes a workpiece carrier to hold and rotate a semiconductor wafer workpiece. The semiconductor wafer workpiece is placed in contact with a rotating polishing pad onto which an abrasive slurry is dispensed. A light emitting means directs a beam of light onto the workpiece carrier. The beam of light is reflected to a positional sensing means that detects variation in the position of the reflected beam of light as the workpiece vibrates due to irregularities in the surface of the workpiece. The positional information of the variation of the reflected beam of light is transferred to a calculating means that will determine the planarization end point from changes in magnitude and frequency of the positional information and a predetermined relationship between the vibration of the workpiece and the planarization end point.

18 Claims, 5 Drawing Sheets

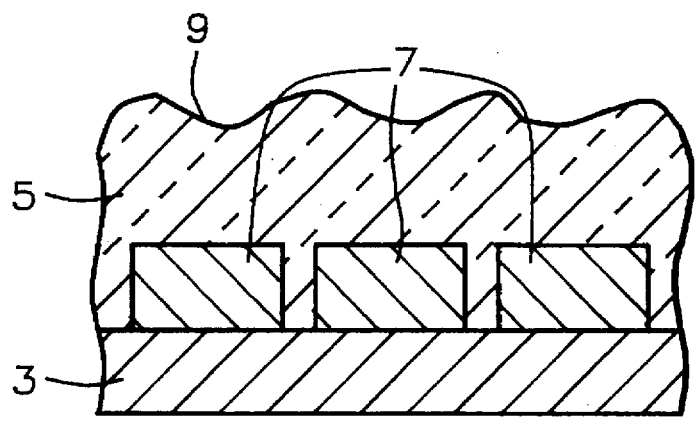
FIG. 1 - Prior Art
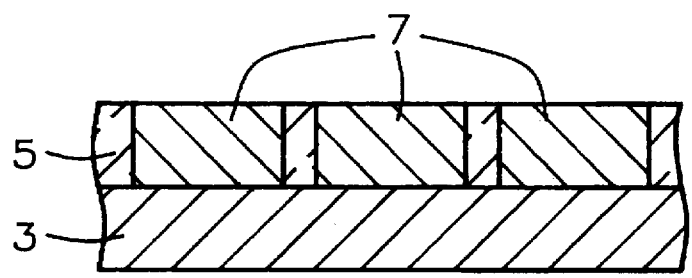
FIG. 2 - Prior Art

NEW CHEMICAL MECHANICAL PLANARIZATION (CMP) END POINT DETECTION APPARATUS

BACKGROUND OF THE INVENTION

1. Field of the Invention

This invention relates to machines and apparatus for polishing semiconductor wafers, and more particularly to a machine for the chemical mechanical planarization (CMP) polishing of semiconductor wafers and the detection of planarization end point.

2. Description of Related Art

The machines to prepare and fabricate semiconductor wafers are well known in the art. Semiconductor wafers are prepared by slicing thin sheets from a semiconductor crystal. The thin sheets are then abraded and polished to eliminate any surface irregularities and to achieve a planar surface.

Integrated circuits (IC's) are then imprinted upon the surface of the semiconductor wafer. The IC's are formed by selective deposition and removal of layers of semiconducting materials, conducting metals such as Aluminum or Tungsten, and insulating materials such as Silicon Dioxide.

The planarization of the semiconductor wafer and the removal of the aforementioned layers may require abrading and polishing. The polishing process may be accomplished by an abrasive slurry lapping process. In this process a semiconductor wafer is mounted on a rotating carrier and placed in contact with a rotating polishing pad. The abrasive slurry is sprayed upon the rotating polishing pad. The material is removed from the semiconductor wafer by the mechanical abrading action of the slurry.

The slurry is a liquid having insoluble abrasive particles held in suspension. Additionally the liquid may have chemical abrasion properties. This form of polishing is referred to as chemical mechanical planarization (CMP).

A particular problem encountered in the use of CMP polishing is in the control of the process parameters to achieve a particular smoothness or to a particular thickness of the deposited materials. In the past, the surface characteristics and the planarization end point of the planarization of the wafer have required the removal of the semiconductor wafers from the polishing apparatus and physically examining the semiconductor wafers to determine dimensional and planar characteristics. The semiconductor wafers must be repeatedly loaded into and removed from the polishing apparatus to complete the planarization process. Additionally excess materials may be removed from the semiconductor wafer, thus causing the semiconductor wafer to be discarded.

U.S. Pat. No. 5,196,353 (Sandhu, et al.) describes a method and apparatus for an in situ determination of planarization end point using thermal imaging during CMP polishing.

U.S. Pat. No. 5,308,438 (Cote, et al.) discloses another method and apparatus for determining a planarization end point in the CMP polishing of layers on a semiconductor workpiece using CMP polishing. The apparatus detects changes in the load current of a motor rotating said semiconductor workpiece.

U.S. Pat. No. 5,337,015 (Lustig, et al.) shows still another method and apparatus for in situ thickness monitoring and planarization end point detection. In this case an electrical signal is passed through the semiconductor wafer and changes in the signal are monitored to detect changes at the surface being polished.

U.S. Pat. No. 5,240,552 (Yu, et al.) discloses yet another apparatus for the detection of planarization end point during CMP polishing of a semiconductor wafer using acoustical waves. The acoustical waves are transmitted through the wafer and the reflected acoustic waves are analyzed to determine the planarization end point and the semiconductor wafer thickness.

U.S. Pat. No. 5,483,568 (Yano, et al.) illustrates a method for determining CMP polishing rate on the surface of a semiconductor wafer. An x-ray beam is directed to an exposed surface of a polishing pad during the CMP polishing of the semiconductor wafer. The intensity of the x-ray fluorescence, which results from the x-ray beam illuminating the polishing pad is detected. The intensity of the fluorescence is related directly to the CMP polishing rate.

SUMMARY OF THE INVENTION

An object of this invention is to provide a chemical mechanical planarization polishing machine incorporating a means to detect planarization end point. Another object of this invention is to provide an in situ detection of the planarization end point.

To accomplish these and other objects, a chemical mechanical polishing machine planarization polishing machine has a workpiece carrier that will hold and rotate a workpiece such as a semiconductor wafer. The workpiece carrier is relatively moveable to a rotating polishing pad. The workpiece is brought in contact with the polishing pad while an abrasive slurry dispenser sprays an abrasive slurry on the polishing pad to polish the workpiece.

A light emitting means emits a beam of light that is focused upon the workpiece carrier. The beam of light is reflected to beam position sensing means. The reflected beam of light will vary in position on the beam position sensing means due to a vibrating of the workpiece during the polishing of the workpiece. The beam position sensing means detect the changes in position of the reflected beam of light. A calculating means evaluates the magnitude and frequency of the changes in position. The magnitude and frequency of the vibrating motion is related to the planarization end point.

BRIEF DESCRIPTION OF THE DRAWINGS

FIG. 1 is cross sectional view of a semiconductor wafer showing the topography of deposited material prior to CMP polishing.

FIG. 2 is a cross sectional view of a semiconductor wafer after CMP polishing.

DETAILED DESCRIPTION OF THE INVENTION

FIG. 1 illustrates a cross section of a semiconductor wafer 3. A conductive metal film 7 is placed on the surface of the semiconductor wafer 3. This conductive metal film forms the connecting wiring for integrated circuits imprinted on the semiconductor wafer 3. An insulating material such as Silicon Dioxide ($SiO_2$) 5 is deposited on the surface of the semiconductor wafer 3 and over laying the conductive metal film 7.

During the deposition process the insulating material 5 can not cover the semiconductor to a uniform thickness causing an uneven surface 9. To smooth the surface 9 and to remove some of the insulating material 5 to reduce the thickness of the insulating material 5 or to expose the underlaying conductive metal film 7, the insulating material 5 will be lapped or abraded. The results of this process are shown in FIG. 2. The insulating material 5 may be lapped and polished using CMP polishing to remove the insulating material 5 to expose the conductive metal film 7 and to smooth or planarize the surface of the insulating material 5.

Figure 3:
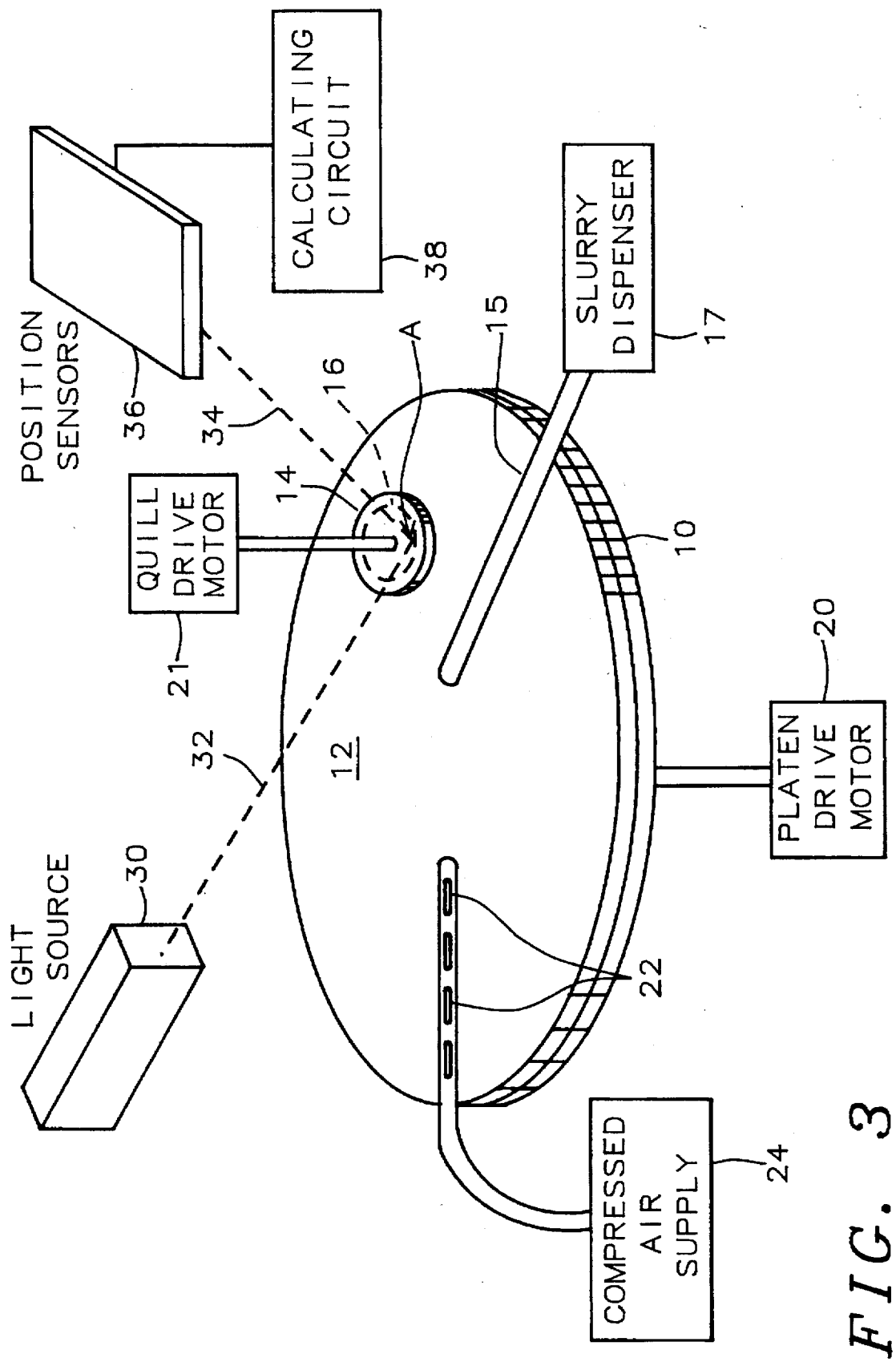
FIG. 3 is a perspective view of a CMP polishing machine incorporating a planarization end point detection system of this invention.

To accomplish the smoothing and the removal of the insulating material 5, a CMP polishing machine is shown in FIG. 3. A platen 10 is attached to a platen drive motor 20 such that the platen 10 may be rotated at a controlled speed. A polishing pad 12 is placed upon and secured to a the platen 10.

A workpiece such as the semiconductor wafer 3 of FIG. 1 is secured to a workpiece carrier 14 and suspended over the polishing pad 12. The quill drive motor 21 is attached to the workpiece carrier 14 to allow said workpiece 16 to rotate in relation to the polishing pad 12.

A slurry dispenser 17 will dispense through a distribution tube 15 an abrasive slurry onto the surface of the polishing pad 12. The rotating workpiece 16 is lowered to contact the rotating polishing pad 12 with a constant downward pressure to perform a CMP polishing in a conventional manner.

A section of piping 18 having a plurality of nozzles 22 is placed above the polishing pad 12 and attached to a compressed air supply 24. The compressed air exits the nozzles 22, when activated, blows away polishing products from the polishing pad 12 and prevents matting of the polishing pad 12. The compressed air removal of polished products is desirable for removal of material layers and be replaced with a nylon brush for removal of insulating materials such as $SiO_2$.

All of the above described structure is conventional and is shown for example in the above discussed patent to Yano, et al.

The CMP polishing machine of FIG. 3 includes a light source 30 that will emit a beam of light 32 to a point A on the workpiece carrier 14. The light source 30 in the preferred embodiment is a laser light of sufficient intensity to be detected by the position sensor 36 but not so intense as to cause damage to the positions sensors 36.

The beam of light 32 is reflected at point A to form the reflected beam 34. The reflected beam 34 impinges upon the position sensor 36. The position sensor 36 will comprise an array of photo sensing devices such as photodiodes, phototransistors, or photo charge coupled devices. The photo sensing devices will convert light of the reflected beam to an electrical signal. The electrical signal will be transferred to the calculating circuit 38 for processing to determine the planarization end point.

Figure 4A:
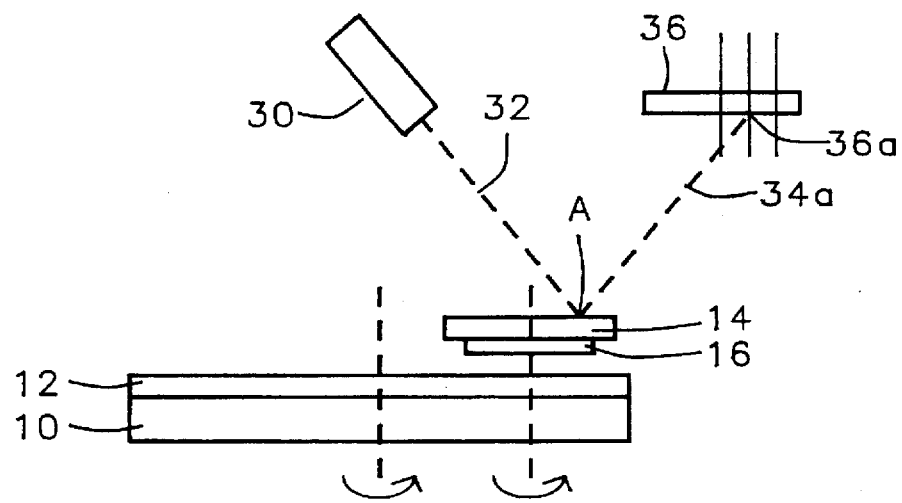
FIGS. 4a–c are simplified side views of the machine of FIG. 3 showing vibration due to topological variations and the function of the end point detection system of this invention.
Figure 4B:
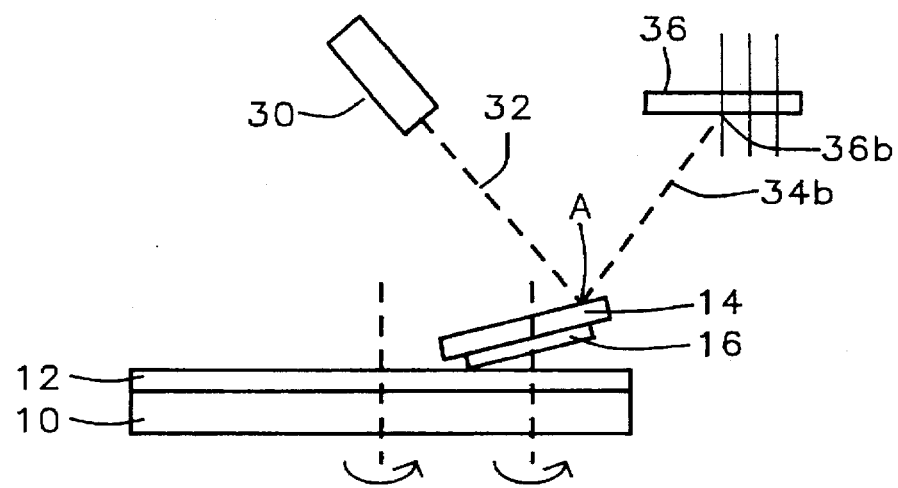
Figure 4C:
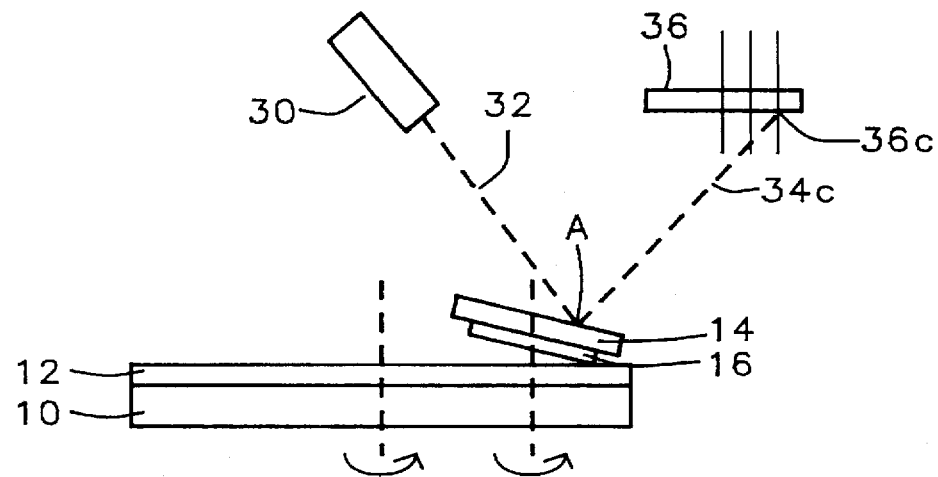

To discuss the determination of the planarization end point refer now to FIGS. 4a–c. FIGS. 4a–c are simplified side views of the CMP polishing machine of FIG. 3. As the polishing pad 12 and platen 10 are rotated and the workpiece carrier 14 containing the semiconductor wafer workpiece 16 is rotated, the semiconductor wafer workpiece 16 is brought in contact with the polishing pad 12 containing an abrasive slurry.

The light source 30 directs the beam of light 32 at point A on the workpiece carrier 14. If there is no vibration of the semiconductor workpiece 16 as it rotates on the polishing pad 12, the reflected light beam 34a will impinge upon the position sensor 36 at point 36a.

At the beginning of the CMP polishing process, the surface of the semiconductor wafer workpiece 16 will have variations in the surface such as those shown in FIG. 1. These variations will cause the vibrations in the semiconductor wafer workpiece 16 that will be transferred to the workpiece carrier 14. The workpiece carrier 14 will be displaced from its normal position as is shown in FIGS. 4b and 4c. As polishing pad 12 rotates the vibrations in the semiconductor workpiece 16 will have a frequency that is less than 500 Hz and a magnitude at the workpiece carrier 14 of from approximately 0.1 μm to a few micrometers.

As the workpiece carrier 14 is displaced as in FIG. 4b, the reflected light beam 34b now impinges upon the position sensor 36 at point 36b. Then, as the workpiece carrier 14 is rotated it will be displaced as in FIG. 4c. The reflected light beam 34c will now move to impinge upon the position sensor 36 at point 36c.

Each photo sensing device will transmit a signal when the light beam 34a, 34b, 34c is detected. This signal will be translated into positional information and the positional information is transferred to the calculating circuit 38 of FIG. 3. The calculating circuit 38 of FIG. 3 will perform a Fast Fourier Transform (FFT) upon the transmitted signal and compare it to a previously determined version of an FFT for the planarization end point detection. When the previously determined version of the FFT and the calculated version are equivalent, the planarization end point has been achieved and the process is completed.

For situations where there is a transition from one material to a second material such as from an oxide to a metal or from a first metal to a second metal, the FFT for this transition will have all so been previously determined and retained. As described in the process above, when the transmitted signal demonstrates the FFT characteristics for the previously determined transition between the material types, the process will have been completed.

Figure 5A:
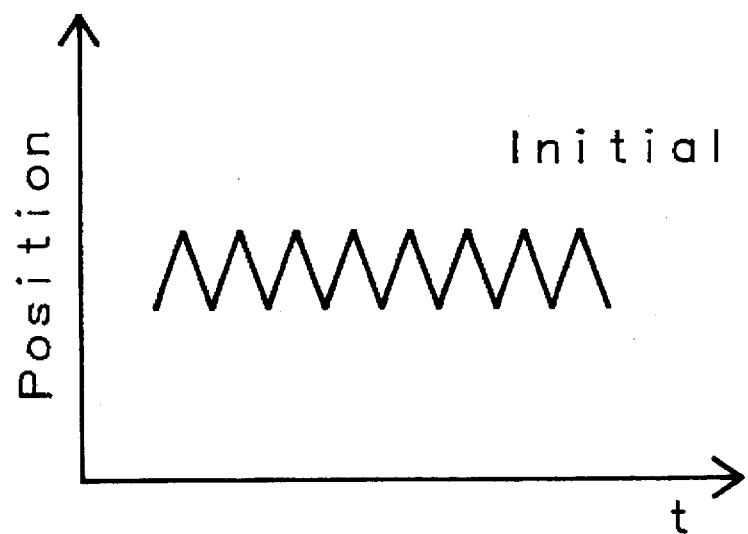
FIGS. 5a and 5b are plots of the output of the position sensor of this invention as function of time.
Figure 5B:
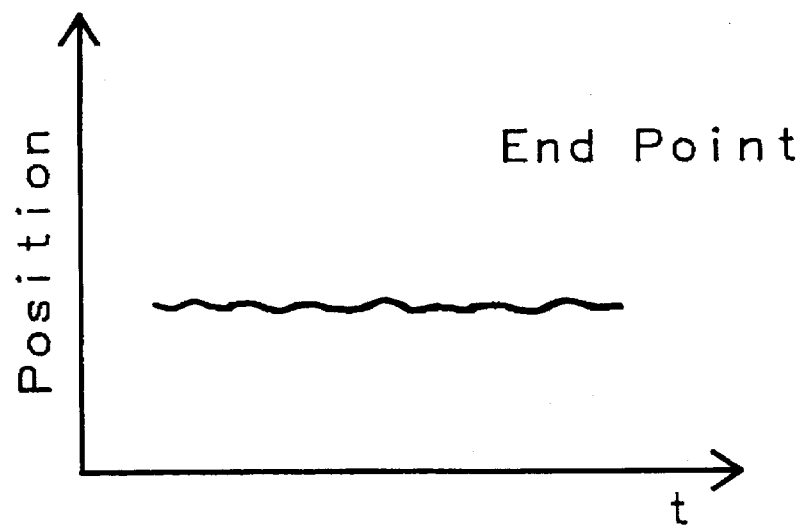

Plots of the positional information are shown in FIGS. 5a and 5b. When the positional information is changing dramatically as shown in FIG. 5a, the surface of the semiconductor wafer workpiece is as shown in FIG. 1. As the surface of the semiconductor workpiece achieves a desired level of smoothness as shown in FIG. 2, the changes in the positional information decrease in magnitude and frequency as shown in FIG. 5b.

Figure 6:
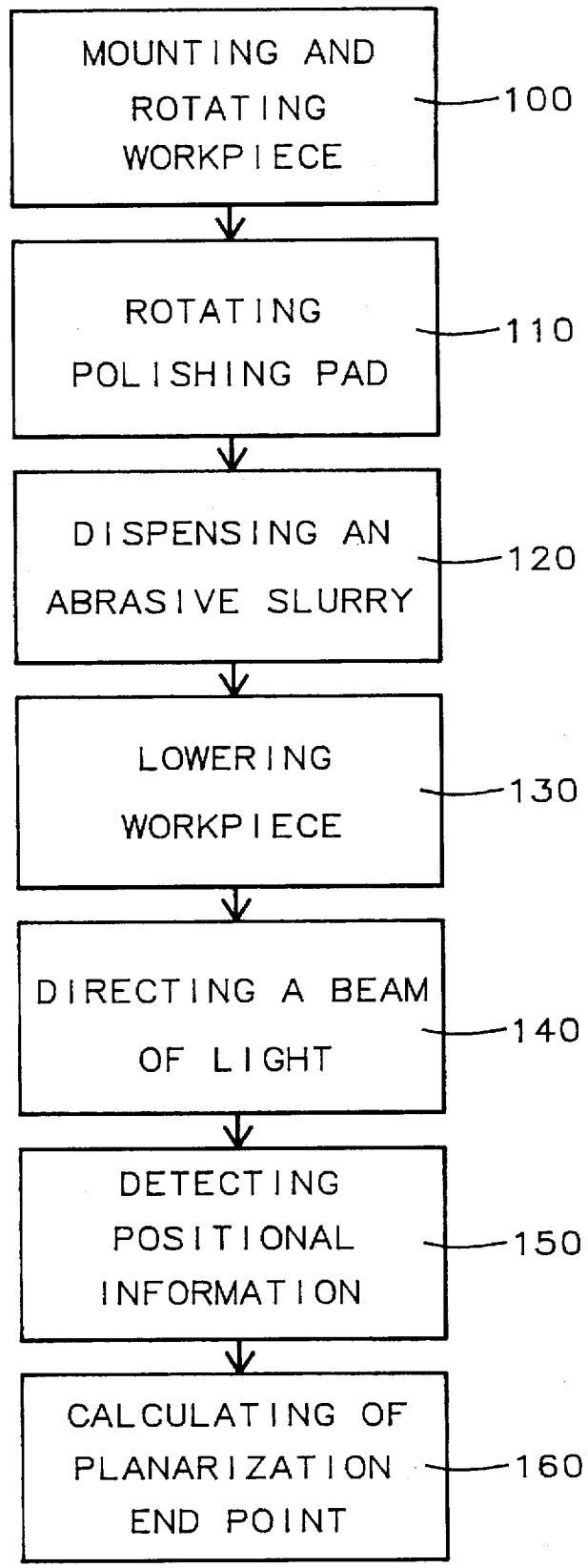
FIG. 6 is a flow diagram of the method for CMP polishing of a semiconductor wafer of this invention.

With reference to FIG. 6, the method for this invention to apply the aforementioned CMP polishing machine includes the steps of:

1. mounting of a semiconductor workpiece upon a workpiece carrier and rotating the workpiece, step 100;

2. rotating a polishing pad that is mounted upon a platen, step 110;

3. dispensing an abrasive slurry upon the polishing pad, step 120;

4. lowering the workpiece to the surface of the polishing pad, step 130;

5. directing a beam of light to the workpiece carrier, step 140;

6. detecting positional information of a reflected beam of light on a position sensor, wherein the position of the reflected beam of light will vary as the magnitude and frequency of the vibrating motion in the semiconductor workpiece rotating on the polishing pad, step 150; and 7. calculating of a planarization end point by evaluating the change in the magnitude and frequency of the positional information and a predetermined relationship between the planarization end point and the vibrating motion of the semiconductor workpiece, step 160.

While this invention has been particularly shown and described with reference to the preferred embodiments thereof, it will be understood by those skilled in the art that various changes in form and details may be made without departing from the spirit and scope of the invention.

What is claimed is:

1. A chemical mechanical planarization polishing machine comprising
    a) a rotatable workpiece carrier to hold a workpiece and impart a rotating motion to said workpiece;
    b) a rotatable polishing pad having an upper surface, wherein said work piece carrier and said polishing pad are relatively moveable to allow the workpiece to be brought in contact with said polishing pad;
    c) an abrasive slurry dispenser to dispense an abrasive slurry onto said upper surface of the polishing pad to abrade and polish said workpiece;
    d) a light emitting means to emit a beam of light, wherein said beam of light impinges upon the workpiece carrier;
    e) a beam position sensing means to detect a positioning of a reflection from said workpiece carrier of said beam of light, wherein said reflection will vary in position due to a vibrating motion of said workpiece during the rotating motion; and
    f) a calculating means to determine an end point of the polishing of said workpiece by evaluating a magnitude and a frequency of a change in the positioning of the reflection and a predetermined relationship between said end point and the vibrating motion of said workpiece.

2. The polishing machine of claim 1 wherein the workpiece includes a semiconductor wafer.

3. The polishing machine of claim 2 wherein said semiconductor wafer has a material including silicon dioxide deposited upon it that must be abraded and polished to control a thickness of said material.

4. The polishing machine of claim 1 wherein said abrasive slurry includes a liquid having abrasive particles in suspension.

5. The polishing machine of claim 1 wherein the beam of light will be focused so as to impinge upon the workpiece carrier at a region wherein the vibrating motion is a maximum of the magnitude.

6. The polishing machine of claim 1 wherein the vibrating motion will vary as a function of the material and a roughness of said workpiece.

7. An apparatus for determining a magnitude and frequency of a vibrating motion of a workpiece carrier that will hold a workpiece and impart a rotating motion to said workpiece, wherein said workpiece is in contact with a rotating polishing pad onto which an abrasive slurry is dispensed to abrade and polish said workpiece, and wherein said apparatus comprises:
    a) a light emitting means to emit a beam of light, wherein said beam of light impinges upon the workpiece carrier;
    b) a beam position sensing means to detect a positioning of the a reflection from said workpiece carrier of said beam of light, wherein said reflection will vary in position due to a vibrating motion of said workpiece during the rotating motion; and
    c) a calculating means to determine an end point of the polishing of said workpiece by evaluating a magnitude and a frequency of a change in the positioning of the reflection and a predetermined relationship between said end point and the vibrating motion of said workpiece.

8. The apparatus of claim 7 wherein the workpiece includes a semiconductor wafer.

9. The apparatus of claim 8 wherein said semiconductor wafer has a material including silicon dioxide deposited upon it that must be abraded and polished to control a thickness of said material.

10. The apparatus of claim 7 wherein said abrasive slurry includes a liquid having abrasive particles in suspension.

11. The apparatus of claim 7 wherein the beam of light will be focused so as to impinge upon the workpiece carrier at a region wherein the vibrating motion is a maximum of the magnitude.

12. The apparatus of claim 7 wherein the vibrating motion will vary as a function of the material and a roughness of said workpiece.

13. A method for performing the process of CMP polishing comprising the steps of:
    a) mounting of a workpiece upon a workpiece carrier and rotating the workpiece;
    b) rotating a polishing pad that is mounted upon a platen;
    c) dispensing an abrasive slurry upon said polishing pad;
    d) lowering the workpiece to the surface of the polishing pad;
    e) directing a beam of light to the workpiece carrier;
    f) detecting positional information of a reflected beam of light on a position sensor, wherein the position of the reflected beam of light will vary as the magnitude and frequency of a vibrating motion in the workpiece rotating on the polishing pad; and
    g) calculating of a planarization end point by evaluating the change in the magnitude and frequency of the positional information and a predetermined relationship between the planarization end point and the vibrating motion of said workpiece.

14. The method of claim 13 wherein the workpiece includes a semiconductor wafer.

15. The method of claim 14 wherein said semiconductor wafer has a material including silicon dioxide deposited upon it that must be abraded and polished to control a thickness of said material.

16. The method of claim 13 wherein said abrasive slurry includes a liquid having abrasive particles in suspension.

17. The method of claim 13 wherein the beam of light will be focused so as to impinge upon the workpiece carrier at a region wherein the vibrating motion is a maximum of the magnitude.

18. The method of claim 13 wherein the vibrating motion will vary as a function of the material and a roughness of said workpiece.

* * * * *